(12) United States Patent
Crozier et al.

(10) Patent No.: US 6,339,834 B1
(45) Date of Patent: Jan. 15, 2002

(54) INTERLEAVING WITH GOLDEN SECTION INCREMENTS

(75) Inventors: Stewart N. Crozier, Groton, MA (US); Andrew Hunt, Ottawa (CA); John Lodge, Kanata (CA); Paul Guinand, Fitzroy Harbour (CA)

(73) Assignee: Her Majesty the Queen in right of Canada, as represented by the Minister of Industry through the Communication Research Centre, Ottawa (CA)

( * ) Notice: Subject to any disclaimer, the term of this patent is extended or adjusted under 35 U.S.C. 154(b) by 0 days.

(21) Appl. No.: 09/320,934

(22) Filed: May 27, 1999

Related U.S. Application Data

(60) Provisional application No. 60/087,591, filed on Jun. 1, 1998.

(30) Foreign Application Priority Data

May 28, 1998 (CA) ................................ 2239212

(51) Int. Cl.[7] .............................. H03M 13/27

(52) U.S. Cl. ...................................... 714/701

(58) Field of Search ........................ 714/701

(56) References Cited

U.S. PATENT DOCUMENTS

| | | | |
|---|---|---|---|
| 4,433,389 A | * 2/1984 | York et al. | 364/900 |
| 4,715,034 A | * 12/1987 | Jacobson | 371/21 |
| 5,056,105 A | 10/1991 | Darmon et al. | 375/1 |
| 5,446,747 A | 8/1995 | Berrou | 371/45 |
| 5,719,875 A | 2/1998 | Wei | 371/2.1 |
| 5,764,649 A | 6/1998 | Tong | 371/2.1 |

FOREIGN PATENT DOCUMENTS

| | | |
|---|---|---|
| EP | 0897223 | 1/1999 |
| GB | 2013002 | 8/1979 |

OTHER PUBLICATIONS

Prabhakar et al., "Efficient Retrieval of Multidimensional Datasets through Parallel I/O", 5th International Conference on High Performance Computing, 1998.*

Guang Gong "Theory and applications of q–ary interleaved sequences" IEEE Trans. On Inform. Theory, Mar. 1995, USA vol. 41, No. 2, pp 400–411.

Chan Ch–K et al: "Efficient use of Pseudo–noise sequences in synchronous direct–sequence spread–spectrum multiple–access communication systems" Proceedings of the Vehicular Technology Conference, US, New York, IEEE, vol. Conf. 44, Jun. 8, 1994, pp. 540–544.

C. Berrou, A. Glavieux, and P. Thitimajshima; "Near Shannon Limit Error–Correcting Coding and Decoding Turbo–Codes"; The Proceedings of ICC 1993. Geneva, Switzerland, May 1993; pp 1064–1070.

C. Berrou, and A. Glavieux; "Near Optimum Error Correcting Coding and Decoding: Turbo Codes"; IEEE Trans. On Comm., vol. 44, No. 10, Oct. 1996.

(List continued on next page.)

*Primary Examiner*—Stephen M. Baker
(74) *Attorney, Agent, or Firm*—Polster, Lieder, Woodruff & Lucchesi

(57) ABSTRACT

Interleavers based on golden-section increments are disclosed for use with Turbo and Turbo-like error-correcting codes. The interleavers have a tendency to maximally spread the error-bursts generated by an error-burst channel or decoder, independent of the error-burst length. The code block size uniquely defines a golden section increment without having to perform a time consuming search for the best increment value. The disclosed embodiments include golden relative prime interleavers, golden vector interleavers and dithered golden vector interleavers. Also disclosed are methods to reduce the size of memory required for storing the interleaving indexes.

45 Claims, 10 Drawing Sheets

OTHER PUBLICATIONS

L. Bahl, J. Cocke, F. Jelinek, and J. Raviv; "Optimal Decoding of Linear Codes for Minimizing Symbol Error Rate"; IEEE Trans. On Inform. Threory, vol. IT–20, Mar. 1974, pp 284–287.

R. Gallager, "Low–Density Parity–Check Codes", IRE Trans. on Inform. Theory, pp. 21–28, Jan. 1962.

B. Battail, "Building Long Codes by Combination of Simple Ones, Thanks to Weighted–Output Decoding", in Proc., URSI ISSSE, Erlangen, Germany, pp. 634–637, Sep. 1989.

J. Lodge, P. Hoeher, and J. Hagenauer, "The Decoding of Multi–Dimensional Codes using Separable MAP 'filters'," in Proc. 16th Biennial Symp. On Communications, Queen's University, Kingston, Canada, pp. 343–346, May 1992.

J. Lodge, P. Hoeher, and J. Hagenauer, "Separable MAP 'filters' for the Decoding of Product and Concatenated Codes," in Proc. IEEE Int. Conf. On Communications, Geneva, Switzerland, pp. 1740–1745, May 1993.

A. Hunt, "Hyper–Codes: High–Performance Low–Complexity Error Correcting Codes", Carleton University, Master's Thesis, to be submitted in Feb. 1998.

A. Viterbi, "Error Bounds for Convolutional Codes and an Asymptotically Optimum Decoding Algorithm", IEEE Trans. Inform. Theory, vol. IT–13, pp. 260–269, Apr. 1967.

G. Forney, "The Viterbi Algorithm", Proc. IEEE, vol. 61, No. 3, pp. 268–278, Mar. 1973.

P. Robertson, E. Villebrun, and P. Hoeher, "A Comparison of Optimal and Sub–Optimal MAP Decoding Algorithms Operating in the Log Domain", Proceedings of ICC'95, Seattle, pp. 1009–1013, Jun. 1995.

P. Robertson, P. Hoeher, and E. Villebrun, "Optimal and Sub–Optimal Maximum a Posteriori Algorithms Suitable for Turbo Decoding", IEEE Communications Theory, vol. 8, No. 2, Mar.–Apr. 1997.

S. Pietrobon, "Implementation and Performance of a Turbo/MAP Decoder", submitted to the International Journal of Satellite Communications, Feb. 21, 1997.

J. Hagenauer, E. Offer, and L. Papke, "Iterative Decoding of Binary Block and Convolutional Codes", IEEE Trans. on Inform Theory, vol. 42, No. 2, pp. 429–445, Mar. 1996.

J. Erfanian, S. Pasupathy, G. Gulak, "Reduced Complexity Symbol Detectors with Parallel Structures for ISI Channels", IEEE Trans. on Communications, vol. 42, No. 2/3/4, pp. 1661–1671, Feb./Mar./Apr. 1994.

B. Talibart and C. Berrou, "Notice Preliminaire du Circuit Turbo–Codeur/Decodeur Turbo4", Version 0.0, Jun., 1995.

* cited by examiner

INTERLEAVING WITH GOLDEN SECTION INCREMENTS

This application claims benefit to Provisional Application No. 60/087,591 filed Jun. 6, 1998.

FIELD OF THE INVENTION

This invention relates to interleaving and is particularly concerned with interleaving systems and methods suited for Turbo and Turbo-like forward-error-correcting codes, by using golden section increments.

BACKGROUND OF THE INVENTION

Interleaving is a key component of many digital communications systems involving forward error correction (FEC) coding. This is especially true for channels characterized by fading, multipath, and impulse noise, for example. A second example is the class of magnetic recording channels where bursts of errors are caused by defects in the recording media. Interleaving, or permuting, of the transmitted elements, provides time diversity for the FEC scheme being employed. An element is used herein to refer to any symbol, sample, digit, or a binary digit (bit). Interleaving spreads out the corrupted portions of the signal and makes it easier for the FEC scheme to correct the associated errors. Conventionally, the interleaving strategy is only weakly linked to the FEC scheme being employed. An exception is the case of concatenated FEC schemes using concatenated Viterbi and Reed-Solomon decoders. The interleaver is placed between the two FEC encoders to help spread out error bursts and the depth of interleaving is directly linked to the error correction capability of the inner (Viterbi) decoder. More recently, however, interleavers have become a more integral part of the coding and decoding strategy itself. Such is the case for Turbo and Turbo-like codes, where the interleaver forms an integral part of the coding scheme. The problem of finding optimal interleavers for such schemes is really a code design problem, and is an on-going area of research.

Claude Berrou obtained U.S. Pat. No. 4,446,747 entitled: "Error-correction coding method with at least two systematic convolutional codings in parallel, corresponding iterative decoding method, decoding module and decoder". This patent describes essentially the same Turbo-code presented by Berrou et al. in their paper "Near Shannon Limit Error-Correcting Coding and Decoding: Turbo-Codes", published in the Proceedings of ICC'93, Geneva, Switzerland, pp. 1064–1070, May, 1993. The Turbo code presented, is a rate ½ binary code that provided performance within 0.5 dB of the BPSK capacity limit at a BER of $10^{-5}$, when using an interleaver block size of 65,536. This result is also only 0.7 dB from the more general Shannon capacity limit. The encoder consists of two rate ½ recursive systematic convolutional (RSC) encoders operating in parallel with the information binary digits (bits) interleaved between the two encoders as shown in FIG. 1. Without puncturing, and with rate ½ constituent codes, the overall code rate is ⅓. This is because the systematic information bits only need to be sent once. Other code rates can be achieved as required by puncturing the parity bits $c^1_k$ and $c^2_k$. In this configuration, the job of the interleaver is to spread error bursts that occur in one code throughout the other code so that there is a higher probability of correcting unreliable information.

More recently Berrou, and Glavieux provided more discussion of the coding and decoding of Turbo codes in their paper "Near Optimum Error Correcting Coding and Decoding: Turbo-Codes", published in the IEEE Trans. on Conm., Vol. 44, No. 10, October 1996.

FIG. 2 illustrates one approach to Turbo decoding, based on maximum a posteriori (MAP) decoding algorithm derived by Bahl et al their paper "Optimal Decoding of Linear Codes for Minimizing Symbol Error Rate", published in IEEE Trans. on Inform. Theory, Vol. IT-20, pp. 284–287, March 1974. The MAP decoder is implemented in the log domain, so the log-MAP algorithm is used. The Turbo decoder uses an iterative process where the de-interleaved output vector of the second log-MAP decoder $L^2$, is fed back to the input of the first log-MAP decoder after the first iteration. The storage vector to the second log-MAP decoder must be interleaved using the same interleaver used in the Turbo encoder. Likewise, the output from the second log-MAP decoder must be de-interleaved before being fed back to the input of the first log-MAP decoder. Decisions can be made either at the output of the first log-MAP decoder or the de-interleaved output of the second log-MAP decoder. It is the convention that one Turbo decoding iteration be defined as two log-MAP decoding operations as shown in FIG. 2.

Interleaving is a key component of any Turbo encoder and decoder, as already shown in FIGS. 1 and 2. Although some form of random or pseudo-random interleaving is usually recommended for Turbo-codes, it has been found that simple structured interleavers can also offer excellent performance, especially for short data blocks on the order of a few hundred bits. Examples of structured prior art interleavers include relative prime interleavers, convolutional interleavers, helical interleaver and L×M matrix (or block) interleavers using L rows and M columns. L×M matrix interleavers are usually implemented by writing into the rows and reading out of the columns, or vice versa. The rows and/or columns are sometimes read in and/or out in a permuted order. This permuted order is often implemented using a relative prime number. That is, the row or column index can be generated using modulo arithmetic where the index increment and row or column lengths are relative prime numbers. With L or M equal to 1, this type of interleaver simply becomes a one-dimensional relative prime interleaver.

In U.S. Pat. No. 5,056,105, Darmon et al refer to relative prime interleavers which seem to offer some advantages over conventional L×M matrix interleavers. In a relative prime interleaver, the n'th digit (element) of the interleaved vector is read out of the original vector using the index s+np, modulo N, where s is an integer starting index and p is an integer index increment. The starting index s is usually set to 0 but can be any index. The increment p must be relative prime to the block size N to ensure that each element is read out once and only once.

One problem with prior art interleavers is that they are usually designed to provide a specific interleaving depth. This is fine if each burst of errors never exceeds the interleaver depth, but it is wasteful if the interleaver is over-designed (too long) and error bursts are much shorter than the interleaver depth. For example, a simple 10×10 matrix interleaver has an interleaving depth of 10 elements. If a burst of 10 errors occurs, the de-interleaver will optimally spread these 10 errors throughout the block of 100 elements. If the error burst is 11 elements long, however, then two errors will again be adjacent. If the error burst is only 2-elements long then these 2 errors will only be spaced 10 elements apart after de-interleaving, but they could have been spaced much farther apart if it was known that only two errors were present. For example, a 2×50 matrix interleaver would have spaced these two errors 50 elements apart. Of course this interleaver is not good for longer bursts of errors. In practice, most channels usually generate error events of random length, and the average length can be time varying, as well as unknown. This makes it very difficult to design optimum interleaving strategies using the above-mentioned prior art methods.

It is also desirable for an interleaving strategy for Turbo-codes to spread "error bursts" from one component decoder throughout the data block for the other component decoder. One measure of how good a particular burst of elements has been spread by an interleaver is the minimum difference between the interleaved indexes of the original burst of elements considered. The problem is that error bursts can start anywhere and are random in length. The best interleaver for one burst length is not necessarily the best interleaver for another burst length. What is sought is an interleaving strategy that is good for any error burst length.

SUMMARY OF THE INVENTION

An object of this invention is to provide an improved interleaver with a tendency to maximally spread the error-bursts generated by an error-burst channel or decoder, independent of the error-burst length.

It is another object of this invention to use golden section increments to achieve desirable spreading properties.

In addressing these objects, the invention makes use of the golden section, which is easy to compute for any block size, and is unique for that block size. In other words, the block size uniquely defines a golden section increment in accordance with this invention, without having to perform a time consuming search for the best increment value. A number of interleaver embodiments, based on this golden section increment, are provided by this invention. The term interleaver is also used to refer to a de-interleaver.

With this invention, there is no concept of interleaver depth and no need to design the interleaver for a particular channel type or for a worst case error-burst length. For Turbo-codes it is also beneficial to obtain good spreading for elements r apart, where r is the repetition period of the feedback polynomial in the RSC encoder, as well as for adjacent elements. As an example, a good binary, rate ½, RSC encoder has a repetition period of $r=2^m-1$, where k and $m=k-1$ are the constraint length and memory, respectively, of the RSC encoder.

In accordance with an aspect of this invention there is provided an interleaving system for rearranging a stream of N input elements into a stream of N output elements, said interleaving system comprising:

(a) an element memory;

(b) an indexer for generating a sequence of input indexes and a sequence of output indexes, wherein at least one of said sequences of indexes is defined in terms of a golden section g equal to $(\sqrt{5}-1)/2$;

(c) an input module coupled to said indexer for writing said stream of N input elements into said element memory according to said sequence of input indexes; and (d) an output module coupled to said indexer for reading said stream of N output element from said element memory according to said sequence of output indexes.

The interleaving system can further comprise an index memory for storing a sequence of index offsets corresponding to the at least one of said sequences of indexes.

Alternatively, the indexer comprises an index memory for storing the at least one of said sequences of indexes. Another alternative is for the indexer to comprise:

(i) an index memory for storing a sequence of input index offsets; and (ii) a nominal index generator coupled to said index memory for generating a sequence of nominal input indexes;

wherein the indexer generates the sequence of input indexes by adding said sequence of input index offsets to said sequence of nominal input indexes.

Yet another alternative is for the indexer to comprise:

(i) an index memory for storing a sequence of output index offsets;

(ii) a nominal index generator coupled to said index memory for generating a sequence of nominal output indexes;

wherein the indexer generates the sequence of output indexes by adding said sequence of output index offsets to said sequence of nominal output indexes.

In a first embodiment of this invention, a golden relative prime interleaver is provided wherein the indexer generates the at least one of said sequences of indexes as a sequence i with elements defined as $i(n)=s+np$, modulo N, where s is a pre-selected integer starting index, p is an integer index increment which is prime relative to N, defined in terms of g, and n is an integer progressively rising from 0 to N−1. The indexer gives p a value close to a real value $c=N(g^m+j)/r$, where m is a pre-selected non-zero integer, r is a non-zero integer defining a distance between any pair of input elements that are to be maximally spread, and j is a pre-selected integer modulo r. In determining the value of p, one approach is to round p to one of a pair of values immediately above and below c. Alternatively, the value of p is selected to maximize a minimum difference between pairs of interleaver indexes within i up to a pre-selected maximum number of elements. Yet another approach is to select the value of p so as to maximize a weighted sum of minimum differences between pairs of interleaver indexes within i for all numbers of elements from 2 up to a pre-selected maximum number of elements. Preferably, $r=1$, $j=0$ and m is a non-zero integer having an absolute value less than 10. It is also preferred to have one sequence of said sequences of indexes to rise from zero to N−1 by an index increment of 1. The golden relative prime interleavers are particularly attractive because they are simple to implement and require little or no additional processing and memory, compared to no interleaving.

In a second embodiment of this invention, a golden vector interleaver is provided, wherein the indexer comprises:

(i) a vector generator for generating a golden vector v with elements defined as $v(n)=s+nc$, modulo N, where s is a pre-selected real starting value, c is a real increment value defined in terms of g, and n is an integer progressively rising from 0 to N−1;

(ii) sorting means responsive to said vector generator for finding a sort vector z determined from $a(n)=v(z(n))$, for n=0 . . . N−1, where a contains the elements of v sorted in one of rising and descending orders; and (iii) assigning means responsive to said sorting means for assigning the at least one of said sequences of indexes i with elements defined by one of $i(n)=z(n)$ and $i(z(n))=n$, for n=0 . . . N−1.

In one aspect of this second embodiment, a dithered golden vector interleaver is provided, wherein the vector generator uses a dither vector d with an n'th real dithering component d(n) of a prescribed distribution D for generating said golden vector such that $v(n)=s+nc+d(n)$, modulo N. Preferably, $c=N(g^m+j)/r$, where m is a pre-selected non-zero integer, r is a non-zero integer defining a distance between any pair of input elements that are to be maximally spread, and j is a pre-selected integer modulo r. Alternatively, the value of c is rounded to one of a pair of integer values immediately above and below the real value of $N(g^m+j)/r$. Preferably, r=1,j=0 and m is a non-zero integer having an absolute value less than 10. It is also preferred to have one of said sequences of indexes rise from zero to N−1 by an index increment of 1. The dithered golden vector interleaver has the desirable spreading properties of the golden vector interleaver, but also has the randomness found beneficial for Turbo-codes.

In a practical embodiment of this invention, at least one interleaving system forms part of a tail-biting Turbo-code encoder comprising a plurality of tail-biting systematic convolutional encoders operating in parallel, wherein each of said at least one interleaving system is positioned at an input of at least one of said plurality of tail-biting systematic convolutional encoders.

In another practical embodiment of this invention, at least one interleaving system forms part of a Turbo-code encoder comprising a plurality of systematic convolutional encoders operating in parallel, wherein each of said at least one interleaving system is positioned at an input of at least one of said plurality of systematic convolutional encoders.

In another aspect of the present invention, there is provided an interleaving method for rearranging a stream of N input elements into a stream of N output elements, said interleaving method comprising the steps of:
  (a) generating a sequence of input indexes and a sequence of output indexes, wherein at least one of said sequences of indexes is defined in terms of a golden section g equal to $(\sqrt{5}-1)/2$;
  (b) writing said stream of N input elements into an element memory according to said sequence of input indexes; and
  (c) reading said stream of N output element from said element memory according to said sequence of output indexes.

Alternative embodiments of this method are provided bearing similar limitations as those provided for the interleaving system defined above.

BRIEF DESCRIPTION OF THE DRAWINGS

Exemplary embodiments of the invention will now be further described with references to the drawings in which same reference numerals designate similar parts throughout the figures thereof, and wherein.

DESCRIPTION OF THE INVENTION

Figure 1:
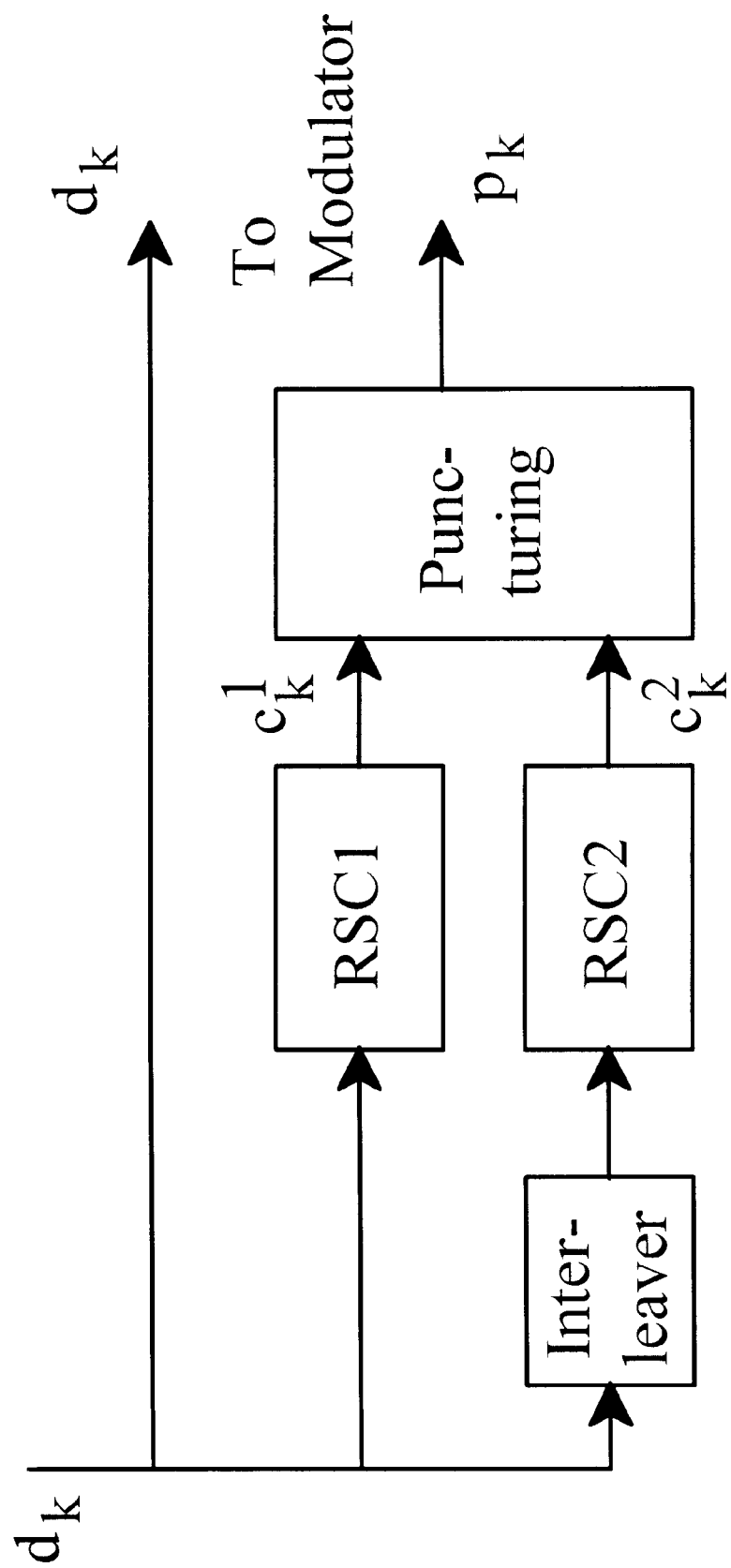
FIG. 1 illustrates, in a block diagram, a Turbo-code encoder using two RSC codes with puncturing according to prior art.
Figure 2:
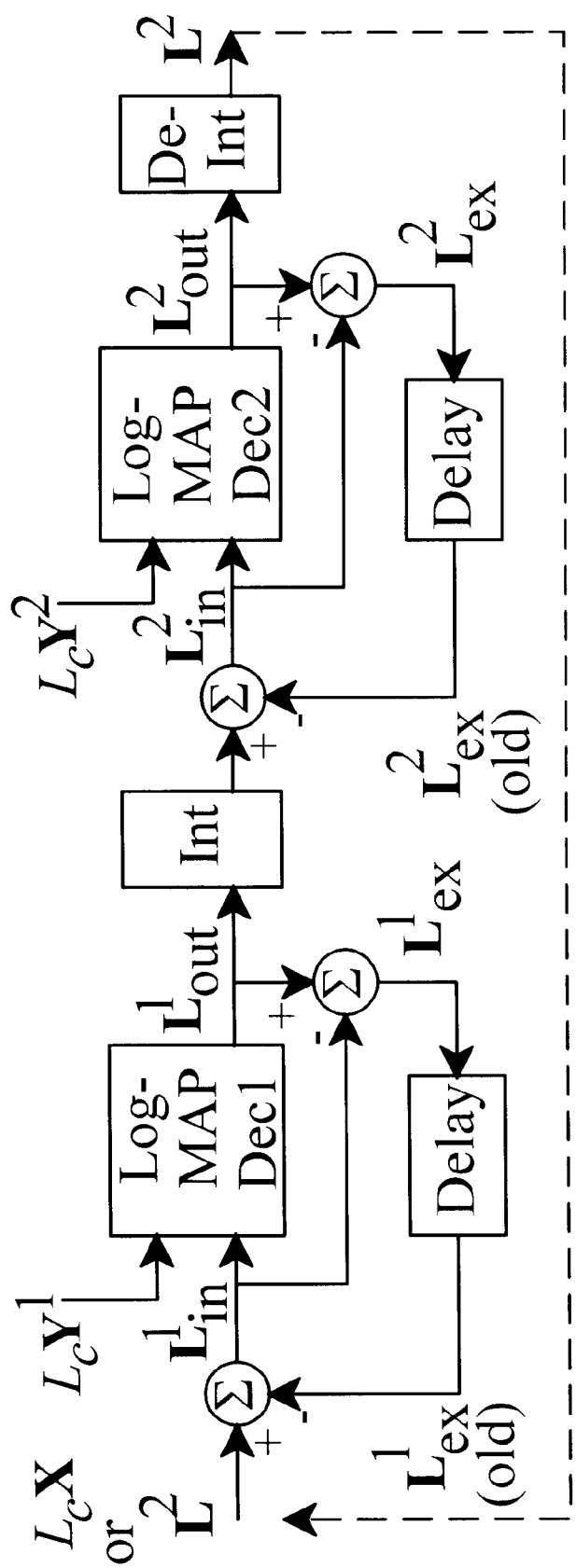
FIG. 2 illustrates, in a block diagram, a Turbo-code decoder using two log-MAP component decoders according to prior art.
Figure 3:
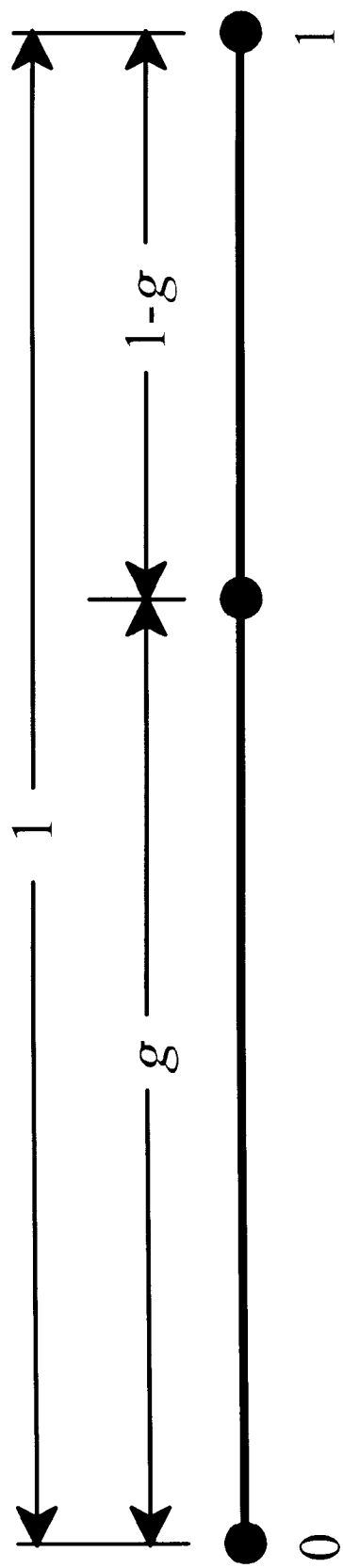
FIG. 3 gives an illustration of the golden section principle.

The golden section arises in many interesting mathematical problems. FIG. 3 illustrates the golden section principle in relation to the interleaving problem of interest. The term interleaving is also used herein to refer to de-interleaving. Given a line segment of length 1, the problem is to divide it into a long segment of length g and a shorter segment of length 1−g, such that the ratio of the longer segment to the entire segment is the same as the ratio of the shorter segment to the longer segment.

That is, $$\frac{g}{1} = \frac{1-g}{g} \tag{1}$$

Solving this simple quadratic equation for g gives the golden section value $$g = \frac{\sqrt{5}-1}{2} \approx 0.618 \tag{2}$$

Now consider points generated by starting at 0 and adding increments of g, using modulo-1 arithmetic. After the first increment there are two points at 0 and g that are 1−g apart, using modulo-1 arithmetic. Modulo distances are used to allow for the option of having the first point start anywhere along the line segment. From equation (1), the distance of 1−g is the same as $g^2$. After the second increment the first and third points determine the minimum distance and this distance is $g^3$. Again, this follows from the definition of g in equation (1). After the third increment the first and fourth points determined the minimum distance and this distance is $g^4$. The minimum distance after the fifth point is the same. The minimum distance after the sixth point is $g^5$. This trend continues, with the minimum distance never decreasing by more than a factor of g when it does decrease. This property follows directly from the definition of the golden section as provided in equation (1). The same distances can also be generated with the complement increment of $(1-g)=g^2 \approx 0.382$. Higher powers of g can also be used for the increment value, but the initial minimum distances are reduced to the smaller increment value.

Figure 9:
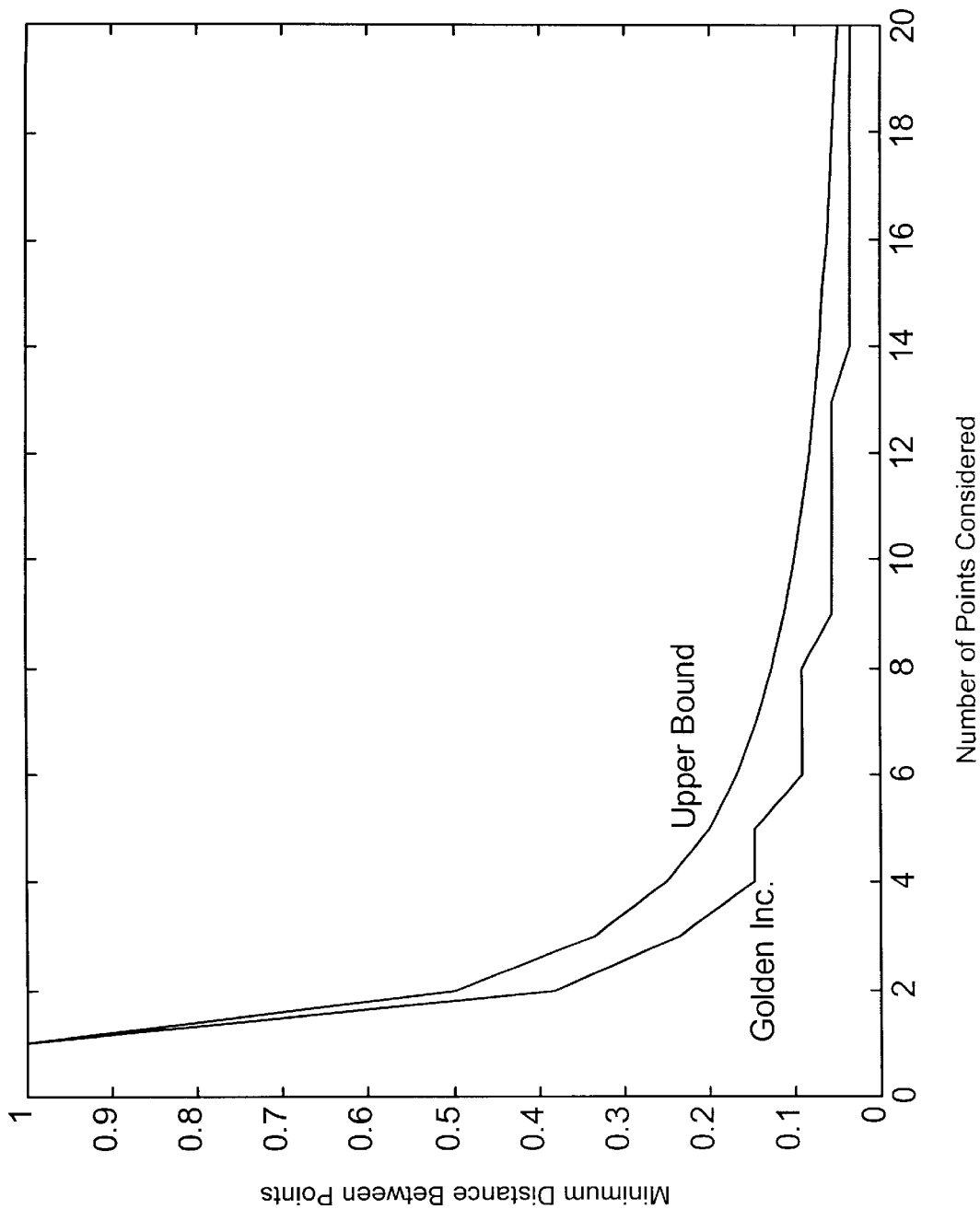
FIG. 9 shows in a graph minimum distances between points versus number of points with a golden section increment, as shown in FIG. 3.

FIG. 9 shows a plot of minimum distances versus the number of points considered, as points are added using an increment of g with modulo-1 arithmetic. FIG. 9 also shows an upper bound for each specific number of points. That is, given n points, but only n points, they could be uniformly spaced with a minimum distance of 1/n. Of course, the golden section increment results are valid for all numbers of points at the same time. The upper bound is not. Even so, the golden section increment results are seen to track the upper bound quite closely. Note that even when the minimum distance drops, most points will still be at the previous minimum distance from their neighbours, with the average distance between points equal to the upper bound.

The properties illustrated in FIG. 9 are desirable for interleavers in general, but in particular are desirable for Turbo-code interleavers. It is now shown how this property of the golden section increment can be used in practical interleavers according to alternative embodiments of this invention.

Figure 4:
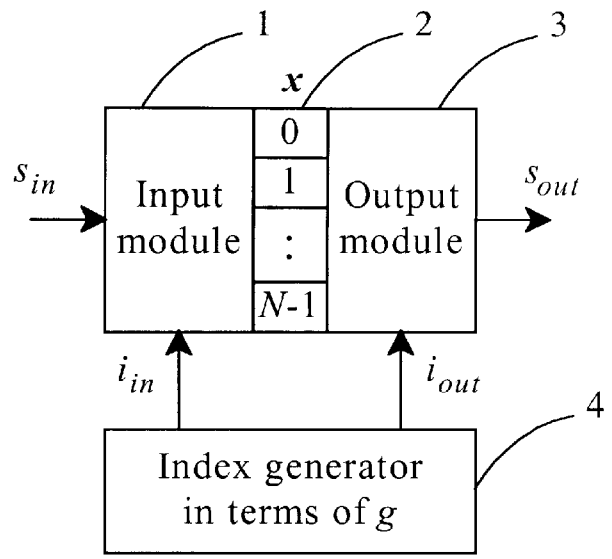
FIG. 4 illustrates, in a block diagram, an interleaver (or a de-interleaver) where the input and output indexes are generated in terms of the golden section value g, in accordance with a first embodiment of this invention.

FIG. 4 illustrates, in a block diagram, an interleaving system (also called an interleaver) using golden section increments, in accordance with a first embodiment of this invention. The same system is alternatively useable for de-interleaving, as will be evident from the discussion further below. In the first embodiment, a stream of N input elements $s_{in}$ is received by input means, in this embodiment input module 1, which is coupled to an element memory 2 and an index generator 4 (also called an indexer). The input module writes this stream $s_{in}$ into a storage vector x, which is stored into the element memory 2, using a sequence of interleaving input indexes $i_{in}$. Output means, in this embodiment output module 3, is also coupled to memory 2 and the indexer 4. The output module 3 reads out a stream of interleaved elements $s_{out}$ from the storage vector x using the sequence of output indexes $i_{out}$. The indexer 4 generates interleaving index sequences $i_{in}$ and $i_{out}$, at least one of which is generated in terms of a golden section value g, calculated as $g=(\sqrt{5-1})/2$. In this particular embodiment, the sequence of input indexes $i_n$ is generated in terms of g, whereas the sequence of output indexes $i_{out}$ is generated using an increment of 1; that is the storage vector x is read out sequentially. However, in an alternative embodiment of the present invention, the sequence of output indexes $i_{out}$ is generated in terms of g, whereas the sequence of input indexes $i_{in}$ is generated using an increment of 1; that is the storage vector x is read in sequentially.

In yet another alternative embodiment of the invention, both $i_{in}$ and $i_{out}$ are generated in terms of g, and are possibly time varying from one input stream to another input stream. In one example, the input indexes for a subsequent input sequence take on the values of the output indexes for the previous output sequence, to facilitate immediate reuse of the storage vector x, on an element-by-element basis, thereby reducing the storage requirement.

Figure 5:
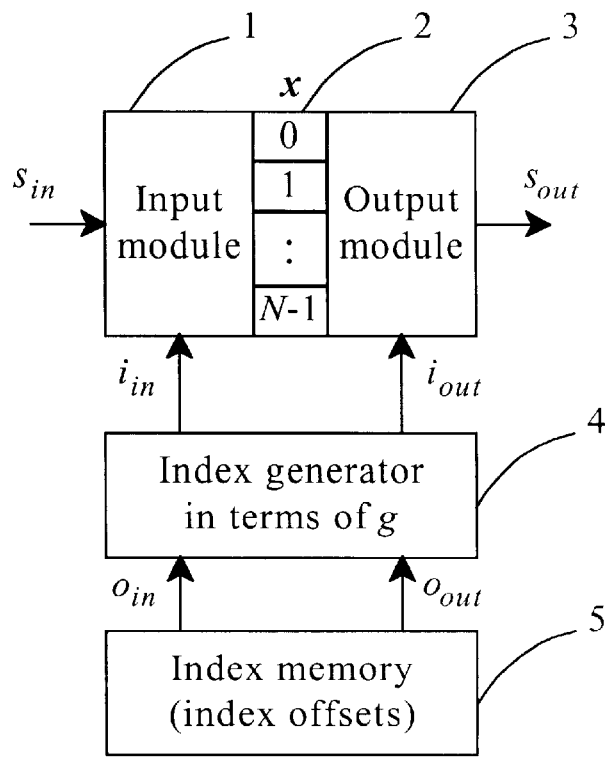
FIG. 5 illustrates, in a block diagram, an interleaver (or a de-interleaver) where the input and output indexes are generated in terms of the golden section value g, and index offsets stored in memory, in accordance with a second embodiment of this invention.

FIG. 5 illustrates, in a block diagram, an interleaving system using golden section increments, in accordance with a second embodiment of this invention. The same system is alternatively useable for de-interleaving, as will be evident from the discussion further below. In the second embodiment, the interleaver has a similar structure, and operates in a similar way, to that of the first embodiment as shown in FIG. 4, but with the addition of an index memory 5 that stores sequences of interleaver index offsets, $o_{in}$ and $o_{out}$ and inputs them to the indexer 4. The indexer 4 is still required to generate nominal input and output indexes, using simple calculations, to which the index offsets are added to calculate $i_{in}$ and $i_{out}$. Index offsets are stored instead of full indexes to save memory. This is explained in more detail below. The interleaving system shown on FIG. 5 is used to implement golden vector as well as dithered golden vector interleaver embodiments, described in more detail below.

FIGS. 4 and 5 also represent de-interleavers. The de-interleaver corresponding to a specific interleaver can be implemented in a number of alternative embodiments. For example, the de-interleaver can be implemented using the same index sequences, $i_{in}$ and $i_{out}$, but where the values of $i_{in}$ and $i_{out}$ are swapped. In one embodiment the interleaver inputs $s_{in}$ into the element memory 2 using write index sequence $i_{in}$, calculated using an index increment of 1, and outputs $s_{out}$ from the element memory 2 using read index sequence $i_{out}$, calculated in terms of golden section value g. The corresponding de-interleaver uses indexes $k_{in}=i_{out}$ for writing its inputs and uses indexes $k_{out}=i_{in}$ for reading its outputs. Alternatively, the de-interleaver inputs using $k_{in}=i_{in}$ and uses the appropriate de-interleaving index sequence $k_{out}$, which undoes the interleaving process. In this case, $k_{out}(i_{out}(n))=n$, $n=0 \ldots N-1$. Several other combinations of $k_{in}$ and $k_{out}$ are also possible for several alternative embodiments of the de-interleaver. In the preferred embodiments described below, $i_{in}$ is calculated using an index increment of 1, and the interleaving index sequence that actually performs the interleaving, $i_{out}$, will simply be referred to as i.

Figure 6:
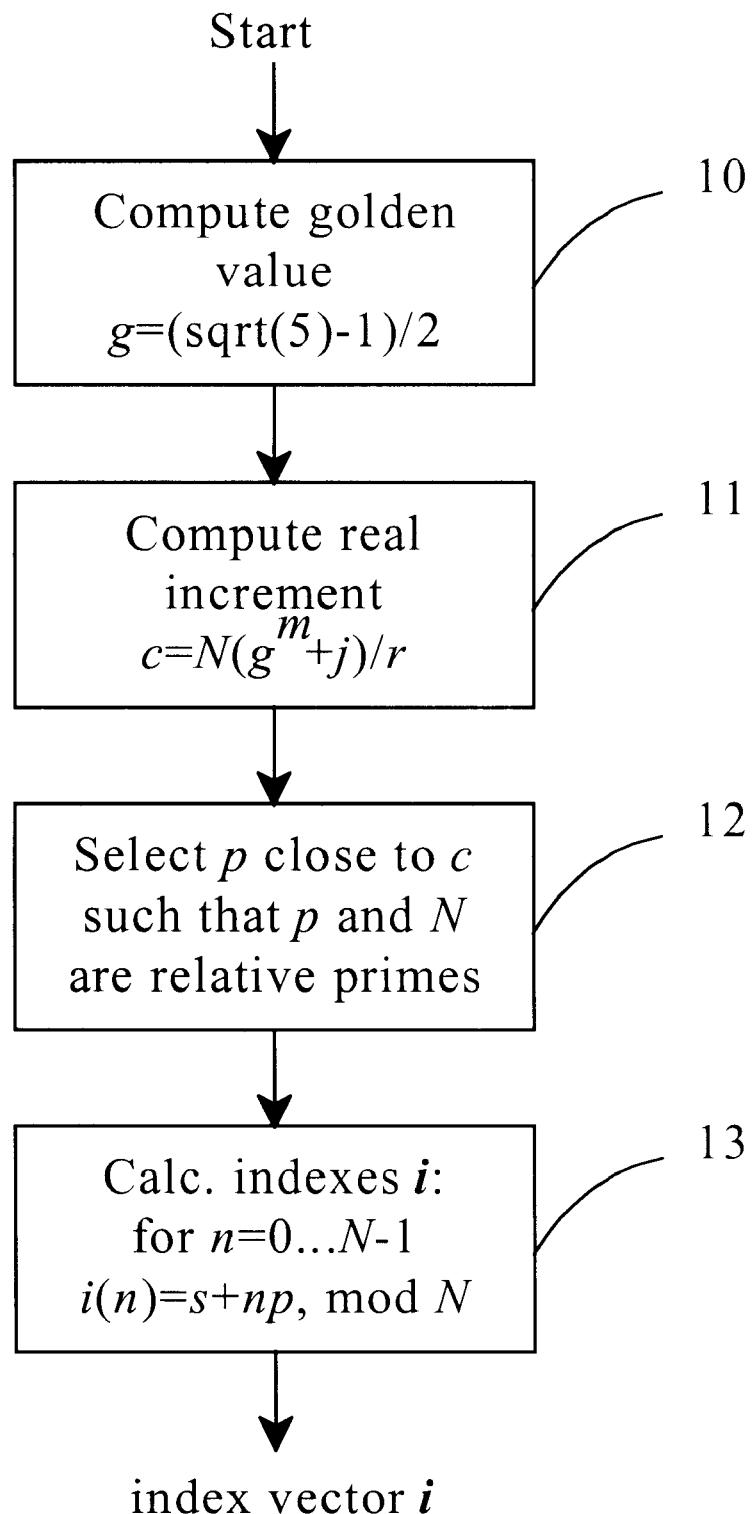
FIG. 6 illustrates, in a flow diagram, a method used to generate the indexes for a golden relative prime interleaver embodiment based on the interleaver shown in FIG. 4.

FIG. 6 shows a method used to generate the indexes for a golden relative prime interleaver embodiment based on the interleaver shown in FIG. 4. This method starts by a first step 10 of computing the golden value g, as defined in (2) above, followed by a second step 11 of computing the real (non-integer) increment c, as defined in (4) below. Using this real increment c, a third step 12 selects an integer index increment p which is relative prime to the interleaver length N to ensure that each element is read out once and only once.

The elements of the interleaving index sequence i are calculated as follows:

$$i(n)=s+np, \text{ modulo } N, n=0\ldots N-1 \quad (3)$$

where s is an integer starting index, and n has an integer value progressively rising from 0 to N−1. The starting index s is preferably set to 0. However, other integer values of s can be selected in alternative embodiments. The integer relative prime increment p, is chosen "close" (as further defined below) to one of the non-integer values of $$c=N(g^m+j)/r \quad (4)$$

where g is the golden section value, m is any positive integer greater than zero, r is the index spacing (distance) between nearby elements to be maximally spread, and j is any integer modulo r. The preferred values for m are 1 and 2. Alternatively, m has one of other relatively small integer values. In a simplified implementation of this embodiment, j is set to 0 and r is set to 1. Preferably for Turbo-codes, greater values of j and r are used to obtain the best spreading for elements spaced apart by r, where r is the repetition period of the RSC encoder, rather than simply for adjacent elements. With this in mind, the preferred choices for j and r are values that result in spreading by approximate golden section spacing for adjacent elements, as well as those spaced by r. For example, j=9 and r=15 are preferred for a memory-4 Turbo-code with an RSC code repetition period of r=15.

Being "close" is defined as falling within a narrow window surrounding the exact real value of c, derived as above from the golden section value g. In the simplest implementation the relative prime p is selected to have the closest value to c, for predetermined values of N, m, j, and r. In those embodiments having j=0 and r=1, the relative prime p is selected to be closest to $Ng^m$. The result is a golden relative prime interleaver with quantization error. For large blocks, the quantization error is usually not significant for short error-burst lengths, but can grow to be significant after many increments. The quantization error problem is mitigated by performing a search for the best relative prime increment p in the vicinity of $Ng^m$, by using a minimum difference between interleaver indexes for a maximum number of elements considered, as a measure of the spreading quality of an interleaver. Alternatively, the best relative prime increment p, in the vicinity of $Ng^m$, is determined by a sum (or weighted sum) of minimum differences between interleaver indexes for all numbers from 2 up to a maximum number of elements considered. In this case, the best choice of p close to $Ng^m$ is that which maximizes an area under the minimum distance curve, as shown in FIGS. 9 and 10.

In the golden relative prime interleaver described above, the storage vector x is not physically interleaved, but is simply read out in an interleaved order when required, without necessarily requiring a memory to store either the interleaver indexes or any interleaved results. In other words, the n'th element of the interleaved output $s_{out}(n)$ is simply read out of the storage vector x using the interleaving index i(n), calculated using modulo arithmetic. As interleaving is simply inherent in the reading and writing of the storage vector x, a convenient implementation of the embodiment of FIG. 4 is to use a digital signal processor (DSP) chip. Most general purpose DSP's available today offer this kind of modulo indexing to implement circular buffers. Thus, there is no need for any additional processing or memory than that required to store and read an uninterleaved vector.

Figure 10:
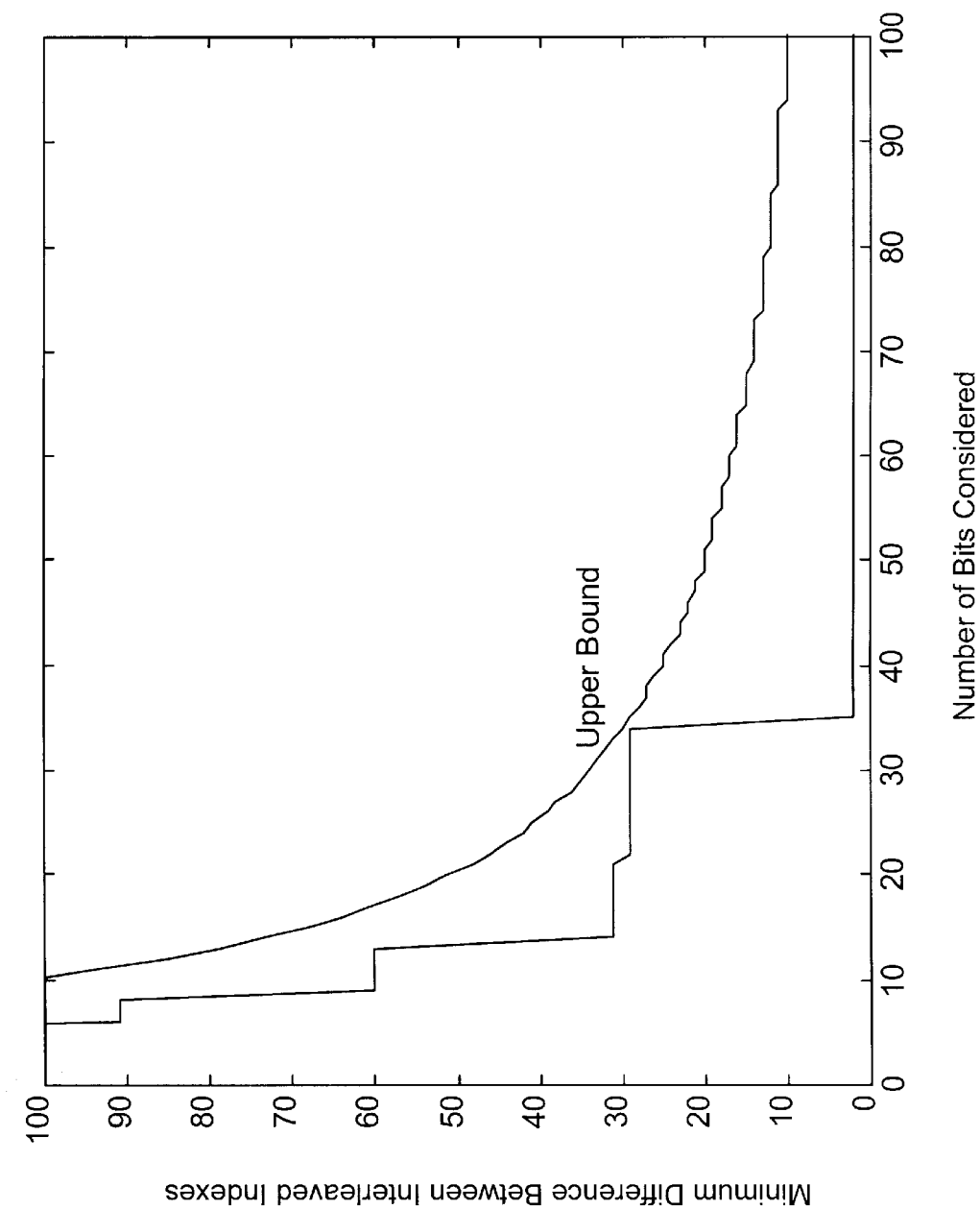
FIG. 10 shows in a graph minimum differences between interleaver indexes versus number of elements considered with a golden relative prime interleaver, as shown in FIG. 6, where N=1028, p=393, area under curve=4620.

FIG. 10 shows the spreading properties for an interleaving method as shown in FIG. 6, having a size N=1028 (used in a Turbo-code encoder with 1024 information bits and 4 flush bits per block), j=0, r=1, m=2 and a relative prime increment of p=393. The value of $c=Ng^2$ is approximately 392.7. The value of p=393 is the closest relative prime. As can be seen, this golden relative prime interleaver performs well in tracking the upper bound, but does not appear to be as good as the curve shown in FIG. 9. The area under the entire curve is 4620. This spreading measure is used to compare the performance of other embodiments discussed further below.

The corresponding golden relative prime de-interleaver, also represented by FIG. 4, performs de-interleaving by writing into x (instead of reading from x) using the same interleaver indexes as described above. Alternatively, the de-interleaver writes the elements with an index increment of 1 and reads out the de-interleaved elements using an index increment of q, where pq=1, modulo N.

Note that golden relative prime interleavers (and de-interleavers) do not necessarily require any memory to store the interleaver indexes, as the indexes are easily calculated as required, in either hardware or software. This is why FIG. 4 does not show any index memory. Alternatively, the indexes are stored in index memory 5, as shown in FIG. 5.

Figure 7:
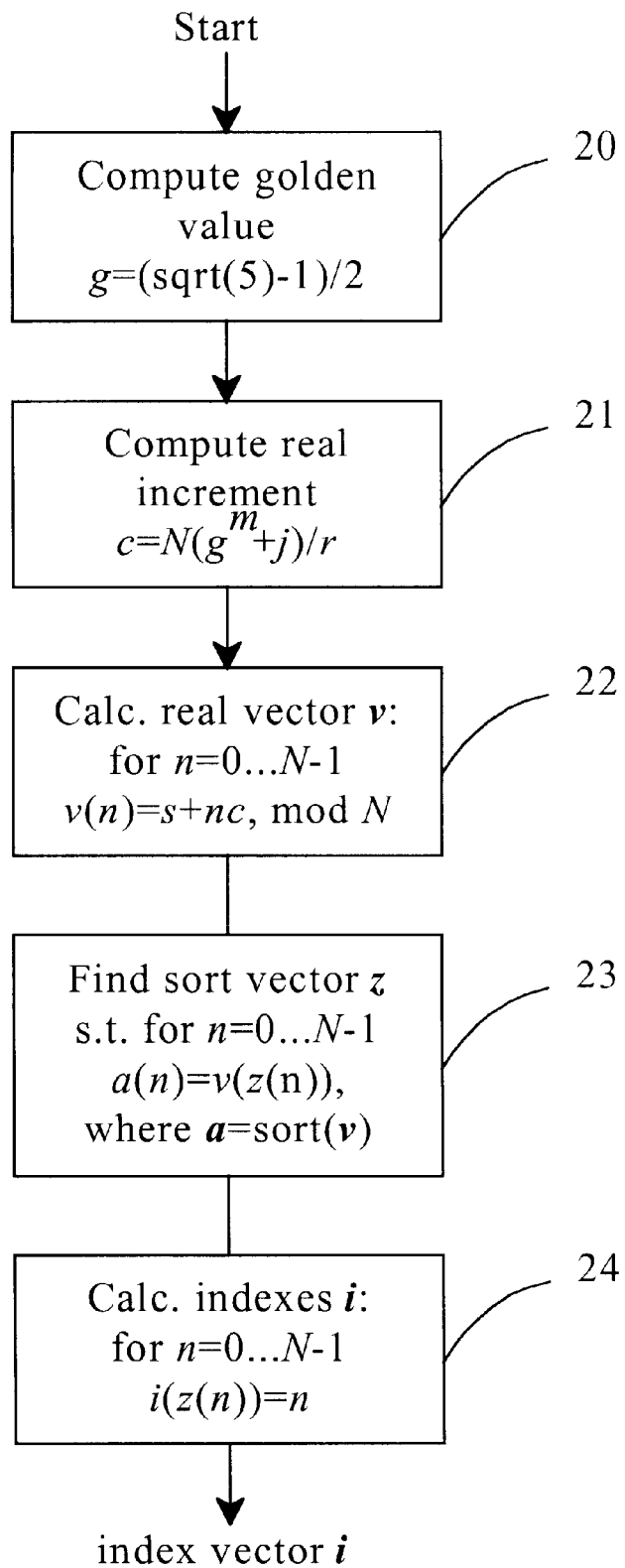
FIG. 7 illustrates, in a flow diagram, a method used to generate the indexes for a golden vector interleaver embodiment based on the interleaver shown in FIG. 5.

FIG. 7 shows a method used to generate the indexes for a golden vector interleaver embodiment based on the interleaver shown in FIG. 5. This interleaving method does not use integer relative primes and integer modulo arithmetic, but rather is based on sorting real-valued numbers derived from the golden section. A first step 20 is to compute the golden section value g. A second step 21 is to compute the real increment value $c=N(g^m+j)/r$, where N is the interleaver length, m is any positive integer greater than zero, r is the index spacing (distance) between nearby elements to be maximally spread, and j is any integer modulo r. A third step 22 is to generate real-valued golden vector v. The elements of v are calculated as follows:

$$v(n)=s+nc, \text{ modulo } N, n=0 \ldots N-1 \quad (5)$$

where s is any real starting value. The fourth step 23 is to sort golden vector v, into an increasing (or alternatively a decreasing) order, and find the index vector z that defines this sort. That is, find sort vector z such that a(n)=v(z(n)), n=0 ... N−1, where a=sort(v). A fifth step 24 then assigns the golden vector interleaver indexes according to i(z(n))=n, n=0 ... N−1. Vector z could also be used directly. In fact, vector z is the de-interleaver for i.

The starting value s is preferably set to 0. However, other real values of s can be selected in alternative embodiments. The preferred values for m are 1 and 2. Alternatively, m has one of other relatively small integer values. In a simplified implementation of this embodiment, j is set to 0 and r is set to 1. Preferably for Turbo-codes, greater values of j and r are used to obtain the best spreading for elements spaced apart by r, where r is the repetition period of the RSC encoder, rather than simply for adjacent elements. With this in mind, the preferred choices for j and r are values that result in spreading by approximate golden section spacing for adjacent elements, as well as those spaced by r. For example, j=9 and r=15 are preferred for a memory-4 Turbo-code with an RSC code repetition period of r=15.

The golden vector interleaver illustrated by FIGS. 5 and 7 does not suffer from accumulating quantization errors, as does the golden relative prime interleaver illustrated by FIGS. 4 and 6. In the golden vector interleaver case, a quantization error only occurs in the final assignment of the indexes. On the other hand, the golden vector interleaver cannot be implemented using the simple modulo-increment indexing method described above for the golden relative prime embodiment. In contrast, the golden vector interleaver indexes must be pre-computed and stored in index memory 5 as shown in FIG. 5 for each block size of interest. If the full indexes are stored, then the size of the index memory can be excessive. For example, an interleaver of length $2^{16}$ elements would require $16 \times 2^{16}$ bits of index memory. By comparison, the storage vector x typically requires only 8-bit words to be stored in the element memory 2, or half of the memory required for index memory 5.

The required size of the index memory 5 is significantly reduced when only storing index offsets. As an example, the n'th index is readily calculated as required using i(n)=floor[v(n)]+o(n), where the floor function extracts the integer part, also called the nominal index, v(n) is calculated using real modulo N arithmetic as in (5), and by definition o(n) is the required index offset stored in the index memory 5. The number of bits that are required to store each index offset is only one or two. Thus, for the example above, the index memory is reduced to $2 \times 2^{16}$ bits, or about ¼ of that required for the storage vector x. This embodiment is represented by FIG. 5.

Figure 11:
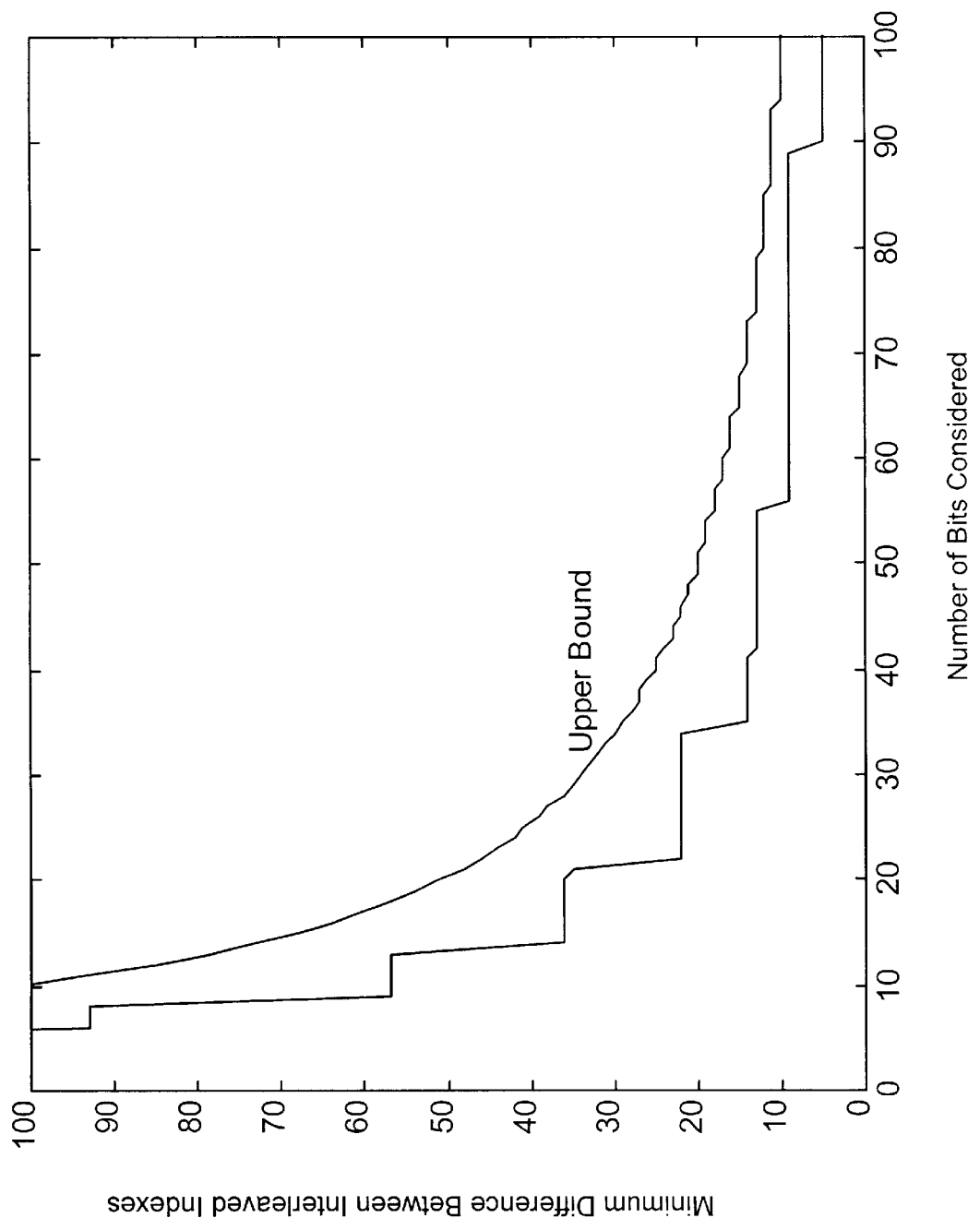
FIG. 11 shows in a graph minimum differences between interleaver indexes versus number of elements considered with a golden vector interleaver, as shown in FIG. 6, where N=1028, area under curve=5250.

FIG. 11 shows the spreading properties for a golden vector interleaver having a size N=1028 (used in a Turbo encoder with 1024 data bits and 4 flush bits per block), j=0, r=1, and m=2. The value of real increment $c=Ng^2$ is approximately 392.7. As can be seen from FIG. 11, the golden vector interleaver performs very well in tracking the theoretical upper bound, and tracks it better than the golden relative prime interleaver curve shown in FIG. 10. Note that the area under the curve has increased from 4620, for the golden relative prime interleaver, to 5250, for the golden vector interleaver, indicating that the golden vector interleaver is better at spreading out error-bursts of arbitrary length.

Figure 8:
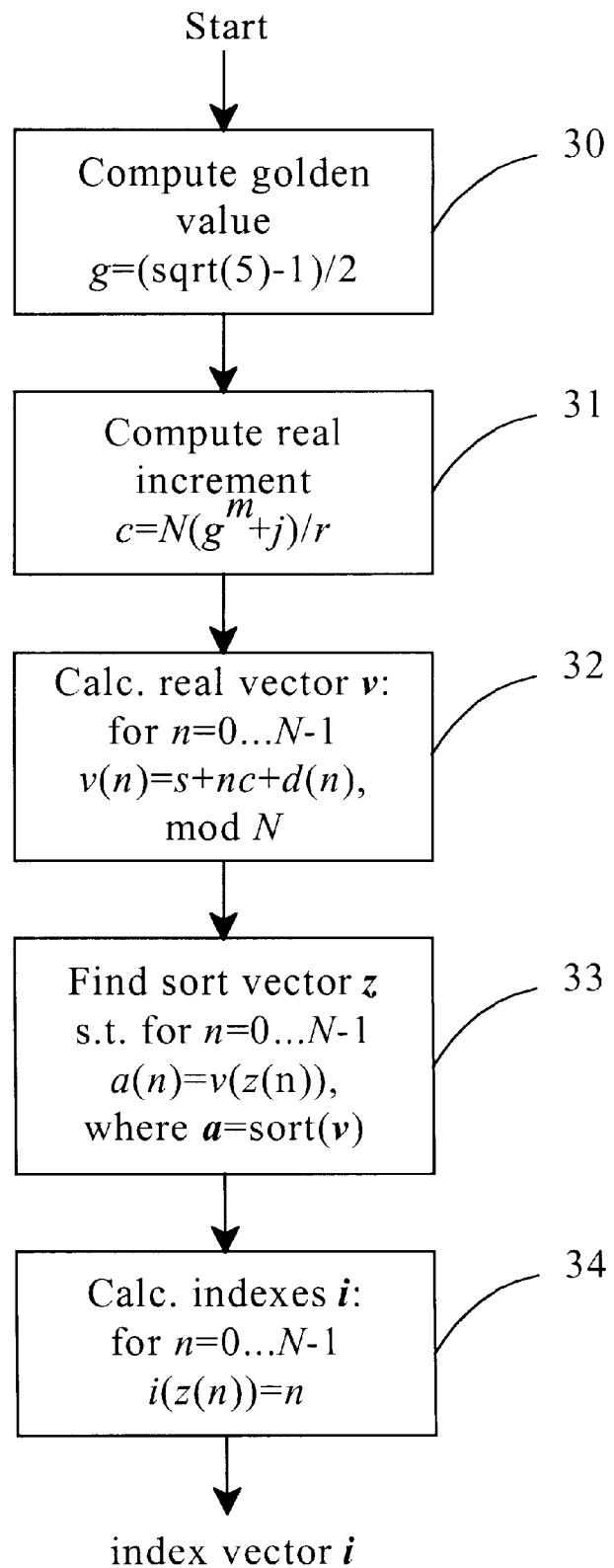
FIG. 8 illustrates, in a flow diagram, a method used to generate the indexes for a dithered golden vector interleaver embodiment based on the interleaver shown in FIG. 5.

It has been found for Turbo-codes that interleavers with some randomness tend to perform better than completely structured interleavers, especially for large block sizes on the order of 1000 or more bits. However, the spreading properties of the golden vector interleaver are still very desirable, both to maintain a good minimum distance (a steep error curve) and to ensure rapid convergence by efficiently spreading error-bursts throughout the block. These two features are encompassed in the dithered golden vector indexing method of FIG. 8. The interleaver is again implemented using the embodiment shown in FIG. 5. This method consists of first to fifth steps 30 to 34 similar to the first to fifth steps 20 to 24 respectively shown in FIG. 7. The only difference between the golden vector method of FIG. 7 and the dithered golden vector method of FIG. 8 is the introduction in the third step 32 of FIG. 8 of a real perturbation (dither) vector d, having a distribution D, included in a golden vector v given by:

$$v(n)=s+nc+d(n), \text{ modulo } N, n=0 \ldots N-1, \quad (6)$$

where d(n) is the n'th dither component. The distribution *D of d has prescribed parameters (e.g. width and standard deviation) with its parameters being scalable with N. In one embodiment, the added dither belongs to a uniform random distribution confined between 0 and $NW_D$, where $W_D$ is the normalized width of the dither distribution. In an alternative embodiment, the distribution is pseudo-random and is easily calculated using a simple formula, such as that used to generate maximal-length-shift-register-sequences (m-sequences). The dithered golden vector v is sorted and the interleaver indexes are generated in a similar manner to the golden vector embodiment described above.

Based on experimental findings for Turbo-codes, a crude rule of thumb for any block size is to use $W_D \approx 0.01$. The result is that for small blocks, on the order of 1000 bits or less, the effect of the dither component is small. For large blocks, on the order of 1000 bits or more, the effect of the dither component naturally increases as the block size increases. In practice, the optimum amount of dither for a specific Turbo-code is a function of the block size and the code rate obtained with puncturing. Similar to the golden vector interleaver, the dithered golden vector interleaver requires the use of index memory for storing pre-computed indexes therein, and therefore cannot be implemented using the simpler method of modulo-increment indexing. The size of index memory can be large if the full indexes are stored, as described previously for the golden vector interleaver.

As for the golden vector interleaver, the required amount of index memory can be significantly reduced by only storing index offsets. As an example, the n'th index is readily calculated as required using i(n)=floor [v(n)]+o(n), where the floor function extracts the integer part, also called the nominal index, v(n) is calculated using real modulo N arithmetic as in (6), and by definition o(n) is the required index offset stored in the index memory 5 of FIG. 5. The number of bits that are required to store each index offset is typically three or four. Thus, for the example above, the index memory is reduced to $4 \times 2^{16}$ bits, or about ½ of that required for the storage vector x. Alternatively, (5) is used to approximate v(n) and the effect of the dither portion is included in the index offsets, without having to compute the dither component in the interleaver. The amount of index memory required is then a function of the width of the dither distribution, but the savings in memory can still be significant. This embodiment is again represented by FIG. 5.

The dithered golden vector interleaver is found to maintain most of the desirable spreading properties of the golden vector embodiment, but is also capable of adding randomness to the interleaver to improve Turbo-code performance for large blocks, in the order of 1000 or more bits. In contrast, the golden relative prime embodiment is suitable for smaller blocks in the order of 1000 or fewer bits because it requires relatively less processing and smaller memory to implement, and provides close to the same performance as the dithered golden embodiment for those block sizes.

A modification to the dithered golden vector interleaver, illustrated by FIGS. 5 and 8, is to round c, as defined in (4), either up or down to the nearest integer value. This constraint ensures that N times c, modulo N, is equal to zero, which in turn ensures that the resulting spreading properties are valid, in a modulo sense, for both the interleaver and the corresponding de-interleaver. Without this constraint, the spreading properties of the de-interleaver, measured using modulo-N arithmetic, are subject to degradation due to edge effects. This is a desirable constraint for tail-biting Turbo-codes, where the modulo-N spreading properties of the de-interleaver are just as important as the modulo-N spreading properties of the interleaver. Note that this constraint is not as severe as selecting the closest relative prime, as is the case for the golden relative prime interleaver. The dither step 32 and sorting step 33 ensure that a valid interleaver will be generated when this constraint is in effect.

Although the description above concerning Turbo-codes is directed to Turbo-codes with two constituent RSC encoders and one interleaver, the same described interleaving techniques are also applicable to generalized Turbo-codes with two or more different interleavers. In the latter case, the interaction between the different interleavers becomes important. A solution that provides good relative spreading between all interleaved sequences is to use different small values of m (i.e. different powers of g) for each of the different interleavers.

It is to be understood that most of the discussion above applied to the term "interleaver" applies equally to the term "de-interleaver", and that interleaving and de-interleaving are symmetrical and inter-dependent processes. Thus, the term "interleaver" is used to refer to either an interleaver or a de-interleaver.

Of course, numerous variations and adaptations may be made to the particular embodiments of the invention described above, without departing from the spirit and scope of the invention, which is defined in the claims.

What is claimed is:

1. An interleaving method for rearranging a stream of N input elements into a stream of N output elements, said interleaving method comprising the steps of:

(a) generating a sequence of input indexes and a sequence of output indexes, wherein at least one of said sequences of indexes is defined in terms of a golden section g equal to $(\sqrt{5}-1)/2$;

(b) writing said stream of N input elements into an element memory according to said sequence of input indexes; and (c) reading said stream of N output elements from said element memory according to said sequence of output indexes.

2. An interleaving method as defined in claim 1, wherein one of said sequences of indexes rises from zero to N−1 by an index increment of 1.

3. An interleaving method as defined in claim 1, wherein step (a) comprises the steps of:

(i) generating a sequence of nominal indexes defined in terms of g;

(ii) reading a sequence of index offsets from index memory; and (iii) combining said sequence of nominal indexes with said sequence of index offsets to generate the at least one of said sequences of indexes.

4. An interleaving method as defined in claim 1, wherein step (a) comprises a step of calculating the at least one of said sequences of indexes as a sequence i with elements defined as i(n)=s+np, modulo N, where s is a pre-selected integer starting index, p is an integer index increment which is prime relative to N, defined in terms of g, and n is an integer progressively rising from 0 to N−1.

5. An interleaving method as defined in claim 4, wherein one sequence of said sequences of indexes rises from zero to N−1 by an index increment of 1.

6. An interleaving method as defined in claim 4, wherein p has a value close to a real value $c=N(g^m+j)/r$, where m is a pre-selected non-zero integer, r is a non-zero integer defining a distance between any pair of input elements that are to be maximally spread, and j is a pre-selected integer modulo r.

7. An interleaving method as defined in claim 6, wherein p is rounded to one of a pair of values immediately below and above c.

8. An interleaving method as defined in claim 6, wherein the value of p is selected to maximize a minimum difference between pairs of interleaver indexes within i up to a pre-selected maximum number of elements.

9. An interleaving method as defined in claim 6, wherein the value of p is selected to maximize a weighted sum of minimum differences between pairs of interleaver indexes within i for all numbers of elements from 2 up to a pre-selected maximum number of elements.

10. An interleaving method as defined in claim 6, wherein r=1, j=0 and m is a non-zero integer having an absolute value less than 10.

11. An interleaving method as defined in claim 1, wherein step (a) comprises the steps of:

(i) generating a golden vector v with elements defined as v(n)=s+nc, modulo N, where s is a pre-selected real starting value, c is a real increment value defined in terms of g, and n is an integer progressively rising from 0 to N−1;

(ii) finding a sort vector z determined from a(n)=v(z(n)), for n=0 . . . N−1, where a contains the elements of v sorted in one of rising and descending orders; and (iii) assigning one of said sequences of indexes a sequence i with elements defined by one of i(n)=z(n) and i(z(n))=n, for n=0 . . . N−1.

12. An interleaving method as defined in claim 11, wherein the step of generating a golden vector comprises a step of calculating c as $N(g^m+j)/r$, where m is a pre-selected non-zero integer, r is a non-zero integer defining a distance between any pair of input elements that are to be maximally spread, and j is a pre-selected integer modulo r.

13. An interleaving method as defined in claim 12, wherein r=1, j=0 and m is a non-zero integer having an absolute value less than 10.

14. An interleaving method as defined in claim 11, wherein the step of generating a golden vector v uses a dither vector d with an n'th real dithering component d(n) of a prescribed distribution D, such that v(n)=s+nc+d(n), modulo N.

15. An interleaving method as defined in claim 14, wherein one of said sequences of indexes rises from zero to N−1 by an index increment of 1.

16. An interleaving method as defined in claim 14, wherein D is a pseudo-random uniform distribution having a width less than N/2.

17. An interleaving method as defined in claim 14, wherein D is a pseudo-random distribution scalable with N.

18. An interleaving method as defined in claim 14, wherein the step of generating a golden vector comprises a step of rounding c to one of a pair of integer values immediately above and below the real value of $N(g^m+j)/r$, where m is a pre-selected non-zero integer, r is a non-zero integer defining a distance between any pair of input elements that are to be maximally spread, and j is a pre-selected integer modulo r.

19. An interleaving method as defined in claim 14, wherein the step of generating a golden vector calculates c as $N(g^m+j)/r$, where m is a pre-selected non-zero integer, r is a non-zero integer defining a distance between any pair of input elements that are to be maximally spread, and j is a pre-selected integer modulo r.

20. An interleaving method as defined in claim 19, wherein r=1, j=0 and m is a non-zero integer with absolute value less than 10.

21. An interleaving system for rearranging a stream of N input elements into a stream of N output elements, said interleaving system comprising:

(a) an element memory;

(b) an indexer for generating a sequence of input indexes and a sequence of output indexes, wherein at least one of said sequences of indexes is defined in terms of a golden section g equal to $(\sqrt{5}-1)/2$;

(c) an input module coupled to said indexer for writing said stream of N input elements into said element memory according to said sequence of input indexes; and (d) an output module coupled to said indexer for reading said stream of N output elements from said element memory according to said sequence of output indexes.

22. At least one interleaving system as defined in claim 21, forming part of a Turbo-code encoder comprising a plurality of systematic convolutional encoders operating in parallel, wherein each of said at least one interleaving system is positioned at an input of at least one of said plurality of systematic convolutional encoders.

23. An interleaving system as defined in claim 21, further comprising an index memory for storing a sequence of index offsets corresponding to the at least one of said sequences of indexes.

24. An interleaving system as defined in claim 21, wherein the indexer comprises an index memory for storing the at least one of said sequences of indexes.

25. An interleaving system as defined in claim 21, wherein the indexer comprises:

(i) an index memory for storing a sequence of input index offsets; and (ii) a nominal index generator coupled to said index memory for generating a sequence of nominal input indexes;

wherein the indexer generates the sequence of input indexes by adding said sequence of input index offsets to said sequence of nominal input indexes.

26. An interleaving system as defined in claim 21, wherein the indexer comprises:
  (i) an index memory for storing a sequence of output index offsets; and
  (ii) a nominal index generator coupled to said index memory for generating a sequence of nominal output indexes;
wherein the indexer generates the sequence of output indexes by adding said sequence of output index offsets to said sequence of nominal output indexes.

27. An interleaving system as defined in claim 21, wherein the indexer generates the at least one of said sequences of indexes as a sequence i with elements defined as i(n)=s+np, modulo N, where
  s is a pre-selected integer starting index,
  p is an integer index increment which is prime relative to N, defined in terms of g, and
  n is an integer progressively rising from 0 to N−1.

28. An interleaving system as defined in claim 27, wherein one sequence of said sequences of indexes rises from zero to N−1 by an index increment of 1.

29. An interleaving system as defined in claim 27, wherein the indexer gives p a value close to a real value $c=N(g^m+j)/r$, where
  m is a pre-selected non-zero integer,
  r is a non-zero integer defining a distance between any pair of input elements that are to be maximally spread, and
  j is a pre-selected integer modulo r.

30. An interleaving system as defined in claim 29, wherein the value of p is rounded to one of a pair of values immediately above and below c.

31. An interleaving system as defined in claim 29, wherein the value of p is selected to maximize a minimum difference between pairs of interleaver indexes within i up to a pre-selected maximum number of elements.

32. An interleaving system as defined in claim 29, wherein the value of p is selected to maximize a weighted sum of minimum differences between pairs of interleaver indexes within i for all numbers of elements from 2 up to a pre-selected maximum number of elements.

33. An interleaving system as defined in claim 29, wherein r=1, j=0 and m is a non-zero integer having an absolute value less than 10.

34. An interleaving system as defined in claim 21, wherein the indexer comprises:
  (i) a vector generator for generating a golden vector v with elements defined as v(n)=s+nc, modulo N, where
    s is a pre-selected real starting value,
    c is a real increment value defined in terms of g, and
    n is an integer progressively rising from 0 to N−1;
  (ii) sorting means responsive to said vector generator for finding a sort vector z determined from a(n)=v(z(n)), for n=0 . . . N−1, where a contains the elements of v sorted in one of rising and descending orders; and
  (iii) assigning means responsive to said sorting means for assigning the at least one of said sequences of indexes a sequence i with elements defined by one of i(n)=z(n) and i(z(n))=n, for n=0 . . . N−1.

35. An interleaving system as defined in claim 34, wherein one of said sequences of indexes rises from zero to N−1 by an index increment of 1.

36. An interleaving system as defined in claim 34, wherein
  $c=N(g^m+j)/r$, where
  m is a pre-selected non-zero integer,
  r is a non-zero integer defining a distance between any pair of input elements that are to be maximally spread, and
  j is a pre-selected integer modulo r.

37. An interleaving system as defined in claim 36, wherein r=1, j=0 and m is a non-zero integer having an absolute value less than 10.

38. An interleaving system as defined in claim 34, wherein the vector generator uses a dither vector d with an n'th real dithering component d(n) of a prescribed distribution D for generating said golden vector v with elements defined as v(n)=s+nc+d(n), modulo N.

39. An interleaving system as defined in claim 38, wherein one of said sequences of indexes rises from zero to N−1 by an index increment of 1.

40. An interleaving system as defined in claim 38, wherein D is a pseudo-random uniform distribution having a width less than N/2.

41. An interleaving system as defined in claim 38, wherein D is a pseudo-random distribution scalable with N.

42. An interleaving system as defined in claim 38, wherein the value of c is rounded to one of a pair of integer values immediately above and below the real value of $N(g^m+j)/r$, where
  m is a pre-selected non-zero integer,
  r is a non-zero integer defining a distance between any pair of input elements that are to be maximally spread, and
  j is a pre-selected integer modulo r.

43. At least one interleaving system as defined in claim 42, forming part of a tail-biting Turbo-code encoder comprising a plurality of tail-biting systematic convolutional encoders operating in parallel, wherein each of said at least one interleaving system is positioned at an input of at least one of said plurality of tail-biting systematic convolutional encoders.

44. An interleaving system as defined in claim 38, wherein $c=N(g^m+j)/r$, where
  m is a pre-selected non-zero integer,
  r is a non-zero integer defining a distance between any pair of input elements that are to be maximally spread, and
  j is a pre-selected integer modulo r.

45. An interleaving system as defined in claim 44, wherein r=1, j=0 and m is a non-zero integer with absolute value less than 10.

* * * * *